(12) United States Patent
Zeller

(10) Patent No.: US 7,911,241 B1
(45) Date of Patent: Mar. 22, 2011

(54) FREQUENCY SYNTHESIZER CIRCUIT COMPRISING A PHASE LOCKED LOOP

(75) Inventor: Sebastian Zeller, Grassbrunn (DE)

(73) Assignee: STMicroelectronics Design and Application GmbH, Grassbrunn (DE)

( * ) Notice: Subject to any disclaimer, the term of this patent is extended or adjusted under 35 U.S.C. 154(b) by 0 days.

(21) Appl. No.: 12/608,522

(22) Filed: Oct. 29, 2009

(51) Int. Cl.
*H03B 21/00* (2006.01)

(52) U.S. Cl. .................. 327/105; 327/150; 327/159

(58) Field of Classification Search .............. 327/105, 327/147, 150, 156, 159
See application file for complete search history.

(56) References Cited

U.S. PATENT DOCUMENTS

| | | | |
|---|---|---|---|
| 5,986,512 A * | 11/1999 | Eriksson | 331/16 |
| 6,044,124 A * | 3/2000 | Monahan et al. | 375/376 |
| 6,823,033 B2 * | 11/2004 | Fahim | 375/376 |
| 6,985,551 B1 * | 1/2006 | Mattisson et al. | 375/376 |
| 7,394,418 B2 * | 7/2008 | Eikenbroek | 341/143 |
| 2009/0212835 A1 * | 8/2009 | Xu et al. | 327/156 |

* cited by examiner

*Primary Examiner* — Lincoln Donovan
*Assistant Examiner* — William Hernandez
(74) *Attorney, Agent, or Firm* — Lisa K. Jorgenson; E. Russell Tarleton; Seed IP Law Group PLLC

(57) ABSTRACT

A frequency synthesizer circuit that reduces undesired spurious sidebands while maintaining phase noise performance having a phase locked loop circuit comprising at least a phase detector, a controlled oscillator, a frequency divider coupled to the controlled oscillator for adjusting a frequency division of the frequency divider in response to a received control signal generated from a divisor value, a dithering circuit for providing a dither signal, and a sigma-delta modulator comprising an input for receiving a multi-bit input signal indicative of at least part of the divisor value. The input of the sigma-delta modulator is coupled with the dithering circuit for receiving the dither signal as a most significant bit of the multi-bit input signal.

17 Claims, 6 Drawing Sheets

FREQUENCY SYNTHESIZER CIRCUIT COMPRISING A PHASE LOCKED LOOP

BACKGROUND

1. Technical Field

The present disclosure pertains to a frequency synthesizer circuit and, more particularly, to a frequency synthesizer circuit having a phase locked loop circuit that reduces undesired spurious sidebands while maintaining phase noise performance.

2. Description of the Related Art

Frequency synthesizers may be employed in communication or entertainment applications such as in receivers for radio frequency tuners for receiving and tuning broadcasting signals. A frequency synthesizer of such system may include a phase locked loop (PLL) comprising a controlled oscillator, such as a voltage controlled oscillator, a loop filter, and a phase-frequency detector. Further, a frequency divider may be coupled to the controlled oscillator for dividing down the frequency of the controlled oscillator output signal. In such frequency divider, the frequency division may be adjusted in response to a control signal at the frequency divider which is indicative of a divisor value. The phase-frequency detector compares the phase and frequency of a periodic input or reference signal against the phase and frequency of the output signal of the frequency divider. The output of the phase-frequency detector is a measure of the phase and frequency difference between the two inputs. Control signals of the phase-frequency detector may be supplied to a charge pump that generates a control signal (e.g., a current signal) that is low-pass filtered by a loop filter and then provided to the controlled oscillator. The controlled oscillator usually generates the output signal of the PLL. This output signal can be used, for example, as controlled oscillator signal for a receiver mixer of a receiver chain in a tuner for radio frequency signals.

In one approach that has been used, the frequency divider divides the frequency of the controlled oscillator in response to a multi-bit divisor value, wherein a sigma-delta modulator is provided that varies at its output a division control signal over time such that the frequency of the controlled oscillator which is divided by the frequency divider may be adjusted according to a fractional divisor value over time.

Figure 1:
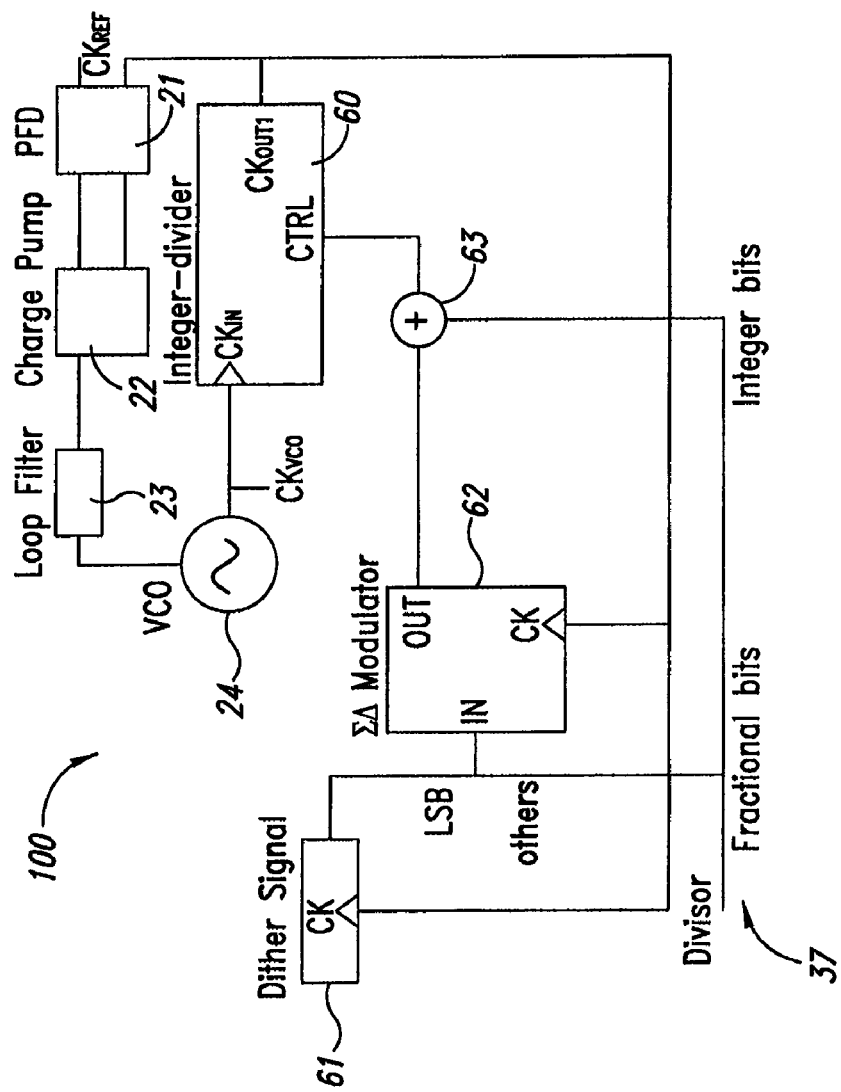

In FIG. 1, there is shown a frequency synthesizer circuit according to one approach that has been used. The frequency synthesizer circuit 100 includes a phase locked loop circuit having a phase-frequency detector (PFD) 21, a charge pump 22, a loop filter 23, a voltage controlled oscillator (VCO) 24, and a frequency divider 60 implemented as an integer-divider 60 and which provides an output signal which is lower in frequency than the VCO output signal. The frequency divider 60 has a control input $CTRL_1$ for adjusting the frequency division in response to a received control signal which is generated from a divisor value 37 provided as a multi-bit input signal having integer bits indicative of an integer part of a divisor value and having fractional bits indicative of a fractional part of the divisor value.

The phase-frequency detector 21 receives the divided VCO output signal from the divider 60 at one input terminal and compares the phase and frequency to a reference signal $CK_{REF}$ received at the other input terminal. Based on the comparison of these signals, the PFD 21 generates control signals to the charge pump 22, which generates a control signal (e.g., a current signal) that is low-pass filtered by the loop filter 23. The output signal of the loop filter 23 is provided to the VCO 24 which tunes the frequency of its output signal $CK_{VCO}$ accordingly. The output signal $CK_{VCO}$ is divided down by the frequency divider 60 which provides an output clock signal $CK_{OUT1}$ divided down from an input clock signal $CK_{IN}$ provided by VCO 24. Further, a sigma-delta modulator 62 is provided which includes an input IN for receiving a multi-bit input signal which contains fractional bits of the divisor value 37 which is used for adjusting the division of the frequency divider 60. An output OUT of the sigma-delta modulator 62 is coupled to an adder 63 which also receives integer bits of the divisor value 37 and produces the control signal supplied to the frequency divider 60. Moreover, a dithering circuit 61 is provided which provides a dither signal coupled as a least significant bit (LSB) of the multi-bit input signal to the input IN of the sigma-delta modulator 62, as set out in more detail below. The circuits 61 and 62 each have a clock input CK for receiving a clock signal provided by the frequency divider 60.

Like any other type of phase locked loop, a sigma-delta PLL (SD-PLL, such as shown in FIG. 1) is a control loop which maintains a fixed phase relation between an external reference clock and an internal generated clock. Due to its loop gain it can be used, in analogy to a non-inverting amplifier, to "amplify" the frequency of a clock source. In other words, it can generate clock frequencies at multiples of an external reference clock frequency.

A digital sigma-delta modulator (SDM) is used in a SD-PLL to control an integer feedback divider such as integer-divider 60 as shown in FIG. 1, in order to obtain not only integer but also fractional multiples of the external reference clock frequency. Hence, a sigma-delta PLL is a so-called fractional-N frequency synthesizer.

Figure 2:
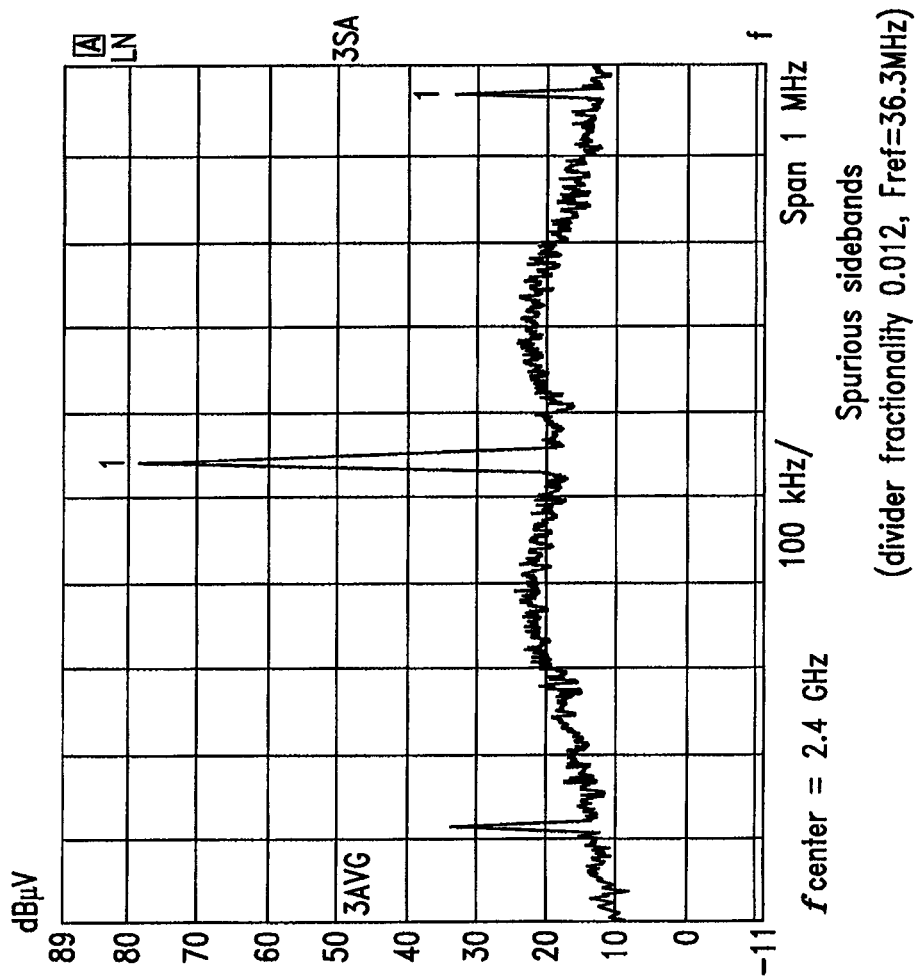

With a constant or periodic input signal, a digital sigma-delta modulator is a periodic system, i.e., the re-occurrence of its internal states shows a certain periodicity. Hence, the quantization noise which is added to the input signal by the SDM is as well periodic and, therefore, in reality the so-called quantization noise is not a random, but instead a deterministic signal. The dominant ones of the discrete tones, the spectra of any periodic signal consists of, are called idle tones in case of sigma-delta quantization noise. These idle tones are present as undesired spurious sidebands at the VCO output in a sigma-delta PLL. In FIG. 2, there is shown a signal diagram showing the spectra of an exemplary sigma-delta quantization noise at the VCO output in a sigma-delta PLL in which the idle tones, which are present as undesired spurious sidebands, are shown as peaks on the left and right sides of the spectrum. A quantization noise such as shown in FIG. 2 may be present in a sigma-delta PLL such as shown in FIG. 1 with a divider fractionality 0.012, a reference frequency Fref=36.5 MHz of the reference clock signal $CK_{REF}$, with 10% charge pump current mismatch and dithering of the LSB of the input signal of the sigma-delta modulator as shown in FIG. 1.

To reduce the total power of all idle tones, it is desirable to maximize the period of the quantization noise signal, which is also called limit cycle. While this is sufficient if the quantization noise is subject to strictly linear signal processing, it is not sufficient in case of non-linear signal processing. Quantization noise which appears to be free of idle tones in a linear system can exhibit significant idle tones in a non-linear system.

As existing PLLs in practice always contain weakly non-linear building blocks, e.g., a single-ended charge pump with inevitable up-/down current mismatch, there is a second requirement to the quantization noise, namely that it must be tolerant to non-linear distortion regarding idle tones.

To increase the limit cycle in conventional sigma-delta PLLs, there is often at the least significant bit (LSB) of the sigma-delta modulator a dither signal injected (e.g., from a linear feedback shift register—LFSR), such as shown in FIG. 1. In this way, the output of the sigma-delta modulator is dithered to change in a pseudo-random fashion so that the power of the noise generated by the sigma-delta-modulator is spread over a frequency band, thereby reducing the power of the noise at a particular frequency. Another strategy of maximizing limit cycles is to set certain initial values in the accumulators of the sigma-delta modulator in such a way that the modulator is forced to loop in the longest possible sequence of unique internal states for any given static input signal. Although good results can be achieved with these methods in idealized simulations with solely linear PLL building blocks, in real-world PLLs their effectiveness is very limited due to insufficient tolerance of the quantization noise to non-linear distortion. This is true for both single loop and cascaded modulators, even if cascaded modulators tend to be more tolerant at the expense of higher quantization noise.

BRIEF SUMMARY

In accordance with one aspect of the present disclosure, a frequency synthesizer circuit is provided that includes a phase locked loop circuit having at least a phase detector, a controlled oscillator for generating a local frequency signal, and a frequency divider coupled to the controlled oscillator and having a control input for adjusting a frequency division of the frequency divider in response to a received control signal generated from a divisor value. The frequency synthesizer circuit further includes a dithering circuit for providing a dither signal, and a sigma-delta modulator comprising an input for receiving a multi-bit input signal indicative of at least part of the divisor value and an output coupled to the control input of the frequency divider. The input of the sigma-delta modulator is coupled with the dithering circuit for receiving the dither signal as a most significant bit (MSB) of the multi-bit input signal. Accordingly, both, limit cycles and tolerance to non-linear distortion can be increased without increasing the quantization noise. The influence of the pseudo-random dither signal at the most significant bit of the sigma-delta modulator is greater than a dither signal applied as least significant bit, as applied in the prior approach according to FIG. 1.

In a further aspect, a multiplier circuit may be coupled to the output of the sigma-delta modulator for multiplying the output signal of the sigma-delta modulator. Particularly, the multiplier circuit multiplies the output signal by a factor of two to obtain unity gain for the dither signal at the sigma-delta modulator. For example, the multiplier circuit includes a shifting circuit for shifting the output signal of the sigma-delta modulator by at least one bit. Accordingly, the output of the sigma-delta modulator is scaled-up by a factor of two by a bit-shift.

According to a further aspect, a subtraction circuit having a first input is coupled to the output of the sigma-delta modulator for receiving a first input signal, and which also has a second input coupled to the dithering circuit for receiving the dither signal. The subtraction circuit is adapted for subtracting the dither signal from the first input signal. In a further aspect, a delay circuit is coupled between the subtraction circuit and the dithering circuit for delaying the dither signal and providing a delayed dither signal to the subtraction circuit. Particularly, the delay of the dither signal corresponds to (e.g., is approximately equal to) a signal propagation delay within the sigma-delta modulator. Accordingly, a delayed version of the dither signal is subtracted from the output signal of the sigma-delta modulator. Choosing a proper n-clock delay which compensates the propagation delay from the input node to the output node at the sigma-delta modulator eliminates the dither signal from the modulator output.

In accordance with another aspect of the present disclosure, a circuit is provided that includes a phase locked loop circuit comprising a frequency divider having a control input and configured to adjust a frequency division of the frequency divider in response to a received control signal generated from a divisor value; a dithering circuit for providing a dither signal; and a sigma-delta modulator comprising an input to receive a multi-bit input signal indicative of at least part of the divisor value, the input coupled to the dithering circuit to receive the dither signal as a most significant bit of the multi-bit input signal, and an output coupled to the control input of the frequency divider.

In accordance with another aspect of the present disclosure, the foregoing circuit includes a subtraction circuit having a first input coupled to the output of the sigma-delta modulator for receiving a first input signal, and a second input coupled to the dithering circuit for receiving the dither signal, wherein the subtracting circuit is adapted for subtracting the dither signal from the first input signal.

In accordance with another aspect of the present disclosure, the foregoing circuit has a delay circuit coupled between the subtraction circuit and the dithering circuit for delaying the dither signal and providing a delayed dither signal to the subtraction circuit, the delay of the dither signal corresponding to a signal propagation delay within the sigma-delta modulator.

BRIEF DESCRIPTION OF THE SEVERAL
VIEWS OF THE DRAWINGS

Figure 3:
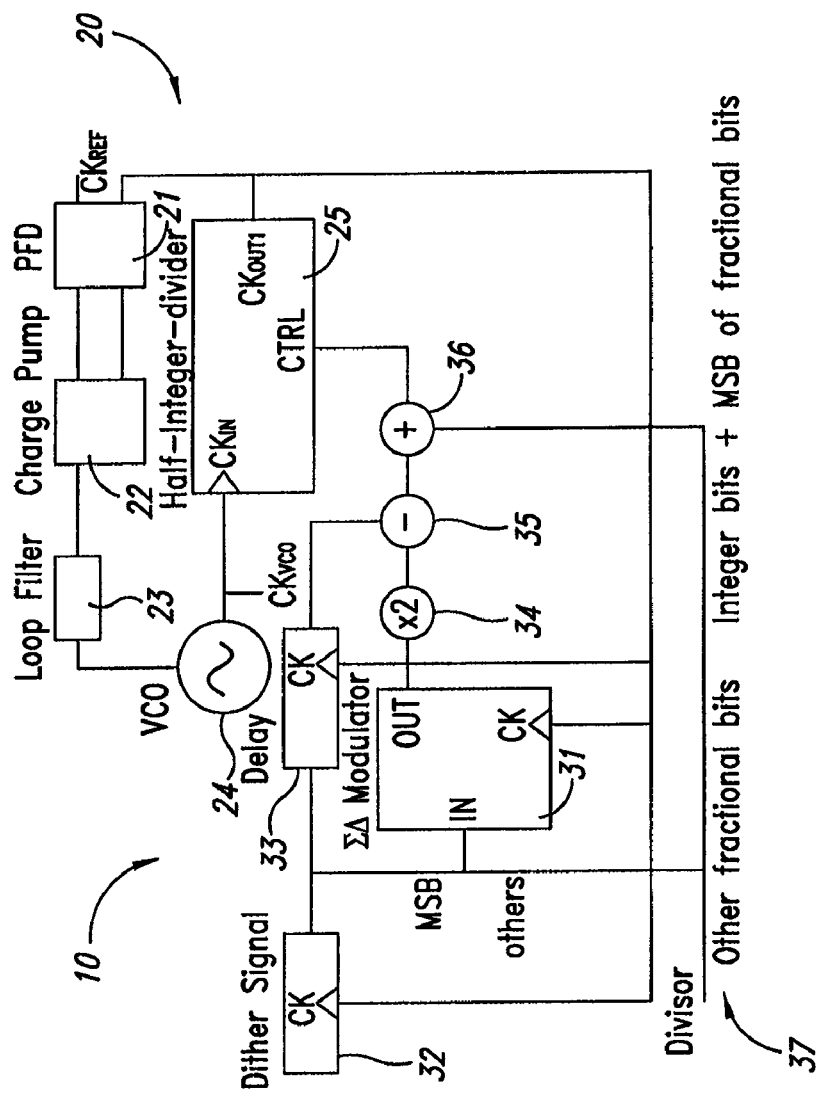
Figure 4:
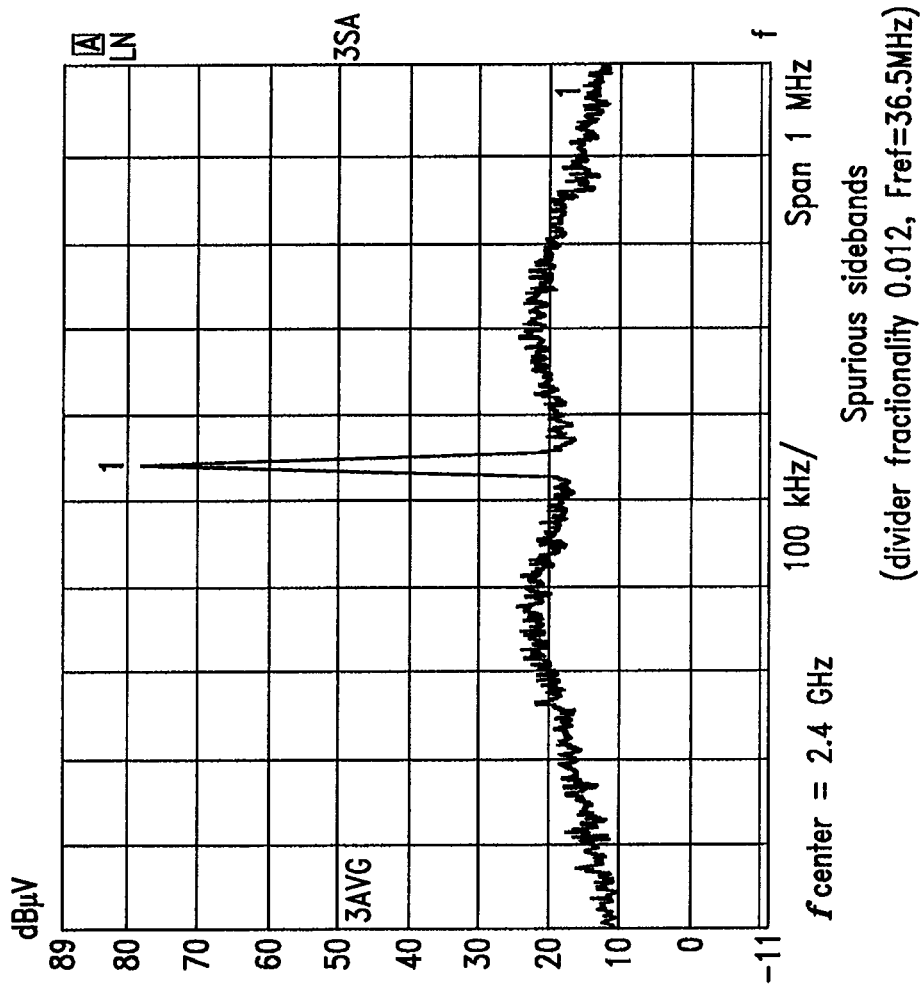
Figure 5:
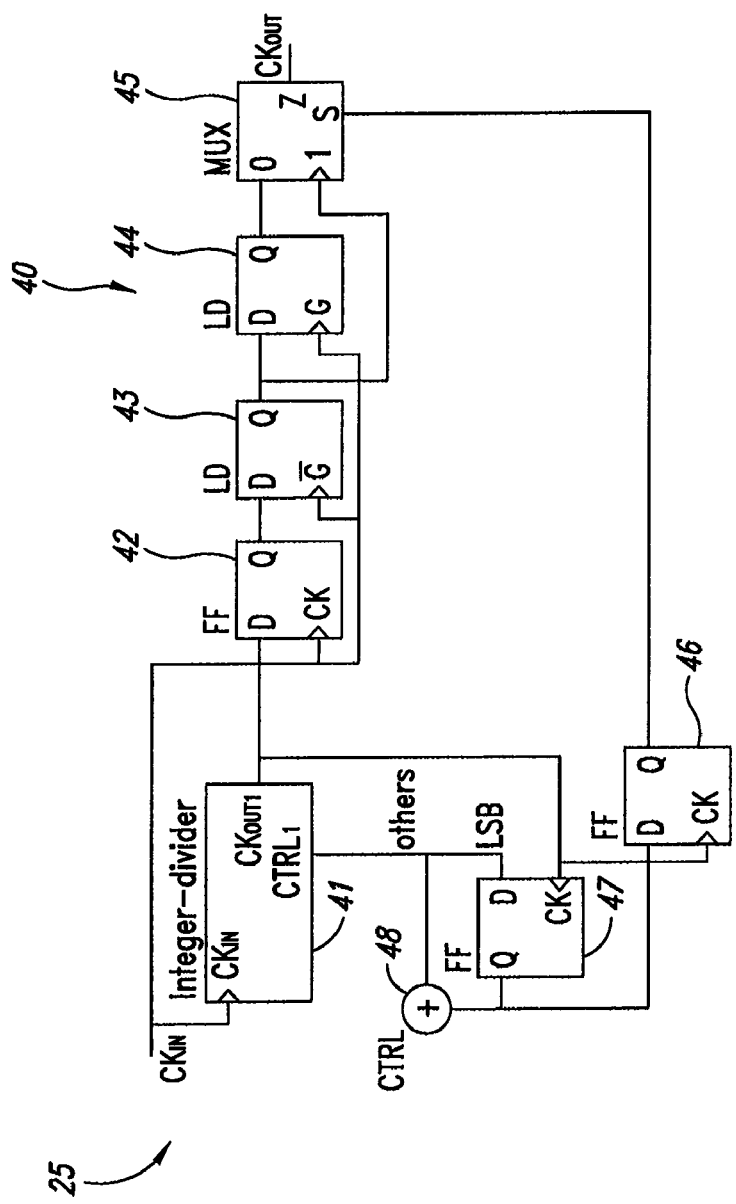
Figure 6:
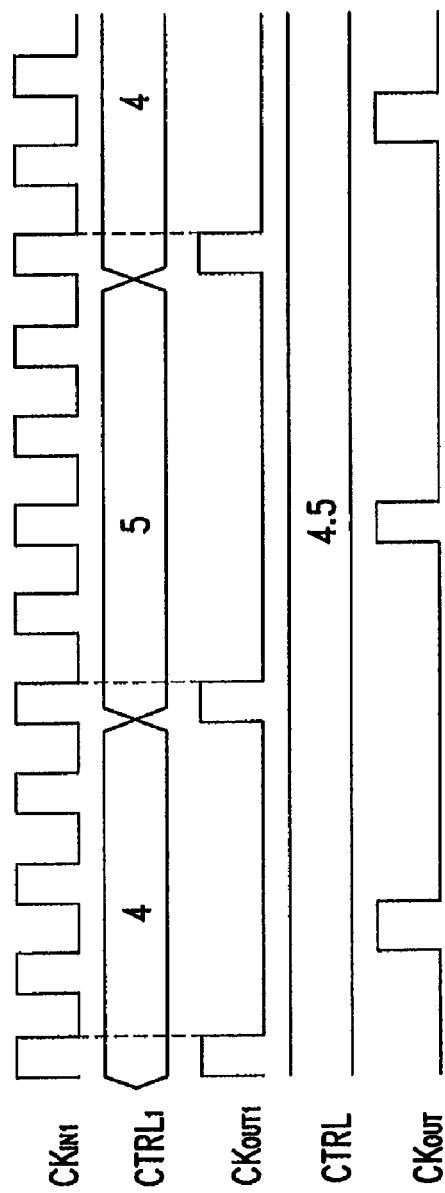

Embodiments of the present disclosure will now be described in more detail with reference to the drawings, in which:

FIG. 1 shows a frequency synthesizer circuit including a sigma-delta PLL according to one approach that has been used, FIG. 2 shows a signal diagram depicting spurious sidebands at the VCO output in a sigma-delta PLL as shown in FIG. 1, FIG. 3 shows an embodiment of a frequency synthesizer circuit implementing a sigma-delta PLL according to aspects of the present disclosure, FIG. 4 shows an exemplary signal diagram of spurious sidebands at the VCO output in the frequency synthesizer circuit as shown in FIG. 3, FIG. 5 shows an embodiment of implementing a half-integer-divider as used in the frequency synthesizer circuit according to FIG. 3, FIG. 6 shows a signal diagram of signals used and generated in the divider circuit as shown in FIG. 5.

DETAILED DESCRIPTION

FIG. 3 shows a block diagram depicting an exemplary frequency synthesizer circuit that implements a sigma-delta PLL according to an embodiment of the present disclosure. The frequency synthesizer circuit 10 includes a phase locked loop circuit 20 which includes a phase-frequency detector 21, a charge pump 22, a loop filter 23, and a voltage controlled oscillator (VCO) 24. With respect to these components, it is also referred to the above description with regard to FIG. 1 in which the same or equivalent components are used. As a difference to the circuit of FIG. 1, the frequency synthesizer circuit 10 according to FIG. 3 implements a half-integerdivider as a frequency divider 25 that is coupled to the controlled oscillator 24. The frequency divider 25 has a control input CTRL for adjusting a frequency division of the frequency divider 25 in response to a received control signal at the control input CTRL which is generated from a divisor value 37, as set out in more detail below. The frequency divider 25 receives at its input $CK_{IN}$ the output signal $CK_{VCO}$ of the controlled oscillator 24 and provides at its output $CK_{OUT}$ a divided down frequency signal supplied to the PFD 21.

The frequency synthesizer circuit 10 further includes a sigma-delta modulator 31 having an input IN and an output OUT and also having a clock input CK for receiving a clock signal from the frequency divider 25. The input IN of the sigma-delta-modulator 31 receives a multi-bit input signal that is indicative of at least part of the divisor value 37. Particularly, the divisor value 37 of the present embodiment includes an integer part (i.e., integer bits) indicative of the integer part of the divisor value, and also includes a fractional part (i.e., fractional bits) indicative of a fractional part of the divisor value. The fractional bits, except for the MSB of the fractional bits, are supplied to the input IN of the sigma-delta modulator 31. The input IN is further coupled with a dithering circuit 32 which provides a dither signal at its output. A clock input CK of the dithering circuit 32 is coupled with the frequency divider 25. The input IN of the sigma-delta modulator 31 is coupled with the dithering circuit 32 in such a way that the dither signal is received as the most significant bit (MSB) of the multi-bit input signal. Therefore, the multi-bit input signal at the input IN includes as MSB the dither signal, wherein the remaining bits of the multi-bit input signal are the fractional bits of the divisor value 37 except for the MSB of the fractional bits. At the output OUT the sigma-delta modulator 31 provides an output signal which includes a reduced number of bits as compared to the multi-bit input signal provided at the input IN.

As a result of reducing the number of bits at the output OUT as compared to the multi-bit input signal at the input IN, to obtain unity gain for the dither signal (provided as MSB at the input IN), the output signal at the output OUT is scaled-up by a factor of two with a corresponding multiplier circuit 34 coupled to the output OUT of the sigma-delta modulator 31. The multiplier circuit 34 multiplies the output signal of the sigma-delta modulator 31 by a factor of two, which may be implemented by a bit-shift. Further, a delay circuit 33 is coupled to the dithering circuit 32 for receiving the dither signal, wherein the delay circuit 33 provides at an output thereof a delayed dither signal. The delay circuit 33 also includes a clock input CK coupled to the output of the frequency divider 25. The delay of the delayed dither signal at the output of the delay circuit 33 corresponds to a signal propagation delay within the sigma-delta modulator 31. Choosing a proper n-clock delay, which compensates the propagation delay from input IN to output OUT at the sigma-delta modulator 31 eliminates the dither signal from the modulator output using a subtraction circuit 35. The subtraction circuit 35 has a first input coupled to the output of the multiplier circuit 34 for receiving the multiplied output signal of the sigma-delta modulator 31 as a first input signal, and has a second input coupled to the output of the delay circuit 33 for receiving the delayed dither signal as a second input signal. The subtraction circuit 35 subtracts the delayed version of the dither signal from the scaled-up output signal of the sigma-delta modulator 31 and provides an output signal which is supplied to the control input CTRL of the frequency divider 25 via an adder 36.

The adder circuit 36 has a first input coupled to the output of the sigma-delta modulator 31, in the present embodiment via the subtraction circuit 35 and the multiplier circuit 34. A second input of the adder circuit 36 is coupled to receive a signal which is indicative of at least part of the divisor value, in the present case indicative of the integer part of the divisor value 37 and the MSB of the fractional part of the divisor value 37. In other words, the adder 36 receives the integer bits and the MSB of the fractional bits of the divisor value 37. The output of the adder circuit 36 is provided to the control input CTRL of the frequency divider 25 to provide the control signal for adjusting the frequency division. The adder circuit 36 adds the modified sigma-delta modulator output signal (with eliminated dither signal) to the integer part and the MSB of the fractional part of the divisor value at the control input CTRL of the frequency divider 25 which is implemented as a half-integer-divider.

FIG. 5 shows an embodiment of a possible implementation of a half-integer-divider according to an embodiment of the present disclosure. Generally, a half-integer frequency divider is a counter that uses both edges of an input clock in order to count in steps of ½ clock periods. Such a divider can be implemented by an integer divider or counter feeding a ½ input clock period delay element and a 1-bit accumulator which drives the integer counter, and a multiplexer selecting either the delayed or non-delayed clock. Particularly, the half-integer divider 25 according to FIG. 5 includes an integer divider 41 having an input $CK_{IN}$ for receiving a corresponding frequency or oscillation signal from the controlled oscillator 24 (FIG. 3). Further, the integer divider 41 includes an output $CK_{OUT1}$ for providing a divided-down frequency or clock signal. The frequency division of the integer divider 41 is controlled through a multi-bit control signal at the control input $CTRL_1$ supplied from an adder circuit 48 that receives at one input thereof the control signal applied at the control input CTRL of the frequency divider 25, as shown in FIG. 3.

Moreover, a delay element 40 is coupled to the output $CK_{OUT1}$ of the integer divider 41 and is also coupled to receive the local frequency signal from the controlled oscillator 24. Particularly, the delay element 40 includes a cascade arrangement of a flip-flop 42 implemented as master-slave-flip-flop coupled to a second master-slave-flip-flop comprising two D-latches in the usual configuration of a first D-latch 43 with inverting gate input and a second D-latch 44 with non-inverting gate input. At the output of D-latch 44 a frequency or clock signal is provided which is shifted by a half period with respect to a frequency or clock signal provided at the output of D-latch 43. Such a signal is provided to a first input of the multiplexer 45 (input 0), whereas the output of the latch 43 is provided to a second input of the multiplexer 45 (input 1). The delay element 40 in this exemplary implementation adds to the output signal of the integer divider 41 either 1.5 or 2 periods delay of the local frequency signal provided by the VCO 24. By providing a corresponding control signal at the select input S of the multiplexer 45 the half-period-delayed version or non-delayed version of the delayed output signal of the integer divider 41 taken from the output of D-latch 43 may be provided at the output $CK_{OUT}$ of the frequency divider 25.

Further, an accumulator circuit 47, 48 is provided for latching at least one bit of the control signal coupled to the control input CTRL of the frequency divider 25. Particularly, the accumulator circuit 47 latches the LSB of the output signal of adder 48, whereas the other bits of the multi-bit signal provided at the adder output are provided to the integer divider 41 as shown. The accumulator circuit 47 includes a master-slave-flip-flop having an output coupled to the adder 48. The output of the flip-flop 47 is added to the control signal at the control input CTRL of the frequency divider 25, wherein the sum thereof is supplied to the integer divider 41. A clock input CK of the flip-flop 47 is coupled with the output $CK_{OUT1}$ of the integer divider 41. The output of the accumulator circuit having flip-flop 47 is also coupled via another master-slave-flip-flop 46 to the select input S of the multiplexer 45.

In the following, an example of a division by 4.5 is described with reference to the signal diagram as shown in FIG. 6, which depicts the signals at the nodes $CK_{IN}$, $CTRL_1$, $CK_{OUT1}$, CTRL, and $CK_{OUT}$. For example, a division by 4.5 is obtained by first dividing by 4 through integer divider 41 and adding 2 clock periods delay of the signal $CK_{IN}$ through delay element 40, then dividing by 5 (switched by accumulator 47, 48) and adding 1.5 clock periods delay, then dividing again by 4 and adding 2 clock periods delay, and so on. Since such a divider is sensitive to the duty cycle of the input clock $CK_{IN}$ and to mismatch of propagation delays, it is not preferred to modulate the LSB of its control word directly with the quantization noise of the sigma-delta modulator, as the resulting LSB non-linearity degrades the noise shaping.

However, due to the bit shift at the output of the sigma-delta modulator within multiplier circuit 34, the LSB at the half-integer divider 25 in FIG. 3 is modulated only by the dither signal. Therefore, it does not carry any quantization noise. So in case of LSB non-linearity at the divider only the dither signal is subject to distortion, but not the quantization noise, i.e., only the suppression of the dither signal is degraded, but not the noise shaping.

Regarding the level of the quantization noise at the divider output, the amplification by the bit-shift at the output of the sigma-delta modulator is compensated by the reduced modulation index of the half-integer divider with respect to the solution according to the prior approach as shown in FIG. 1. Therefore, the phase noise at the divider output is the same as in the prior approach implementation.

It is preferred to generate the dither signal with an n-register linear feedback shift register (LFSR), where the number of registers n is chosen such to spread the power of the dither signal over as many tones (number of tones given by $2^n-1$) as possible but still to satisfy the condition $f_{ref}/2^n >>$ PLL loop bandwidth. For example, a PLL with a bandwidth of 200 kHz and a reference frequency of 40 MHz might use an LFSR with length n=4. In this way, the dither signal can be kept below the level of the quantization noise and other noise sources within the PLL even at significant LSB non-linearity at the divider.

With respect to the signal diagram shown in FIG. 4, when compared to the prior approach (FIG. 1), with the new dithering technique according to aspects of the present disclosure, as described with respect to the embodiment of FIG. 3, a significant reduction in the spurious level of −20 dB could be measured, when comparing the signal diagram of FIG. 4 vs. the signal diagram of FIG. 2, while the phase noise performance is identical.

While this detailed description has set forth some embodiments of the present disclosure, the appended claims cover also other embodiments of the present disclosure which may differ from the described embodiments according to various modifications. It is to be understood that the above description is intended to be illustrative and not restrictive. Moreover, in this disclosure the terms "first", "second", and "third", etc. are used merely as labels, and are not intended to impose numerical requirements on their objects. Other embodiments and modifications within the scope of the claims will be apparent to those of skill in the art upon studying the above description in connection with the drawings.

The scope of the present disclosure should, therefore, be determined with reference to the appended claims.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A frequency synthesizer circuit, comprising:
a phase locked loop circuit comprising at least a phase detector, a controlled oscillator for generating a local frequency signal, and a frequency divider coupled to the controlled oscillator and having a control input to adjust a frequency division of the frequency divider in response to a received control signal generated from a divisor value;
a dithering circuit that provides a dither signal; and
a sigma-delta modulator comprising an input that receives a multi-bit input signal indicative of at least part of the divisor value and an output coupled to the control input of the frequency divider,
wherein the input of the sigma-delta modulator is coupled with the dithering circuit to receive the dither signal as a most significant bit of the multi-bit input signal.

2. The frequency synthesizer circuit of claim 1, further comprising a multiplier circuit coupled to the output of the sigma-delta modulator for multiplying an output signal of the sigma-delta modulator.

3. The frequency synthesizer circuit of claim 2, wherein the multiplier circuit multiplies the output signal of the sigma-delta modulator by a factor of two.

4. The frequency synthesizer circuit of claim 2, wherein the multiplier circuit comprises a shifting circuit for shifting the output signal of the sigma-delta modulator by at least one bit.

5. The frequency synthesizer circuit of claim 1, further comprising a subtraction circuit having a first input coupled to the output of the sigma-delta modulator for receiving a first input signal, and a second input coupled to the dithering circuit for receiving the dither signal, wherein the subtracting circuit is adapted for subtracting the dither signal from the first input signal.

6. The frequency synthesizer circuit of claim 5, further comprising a delay circuit coupled between the subtraction circuit and the dithering circuit for delaying the dither signal and providing a delayed dither signal to the subtraction circuit, the delay of the dither signal corresponding to a signal propagation delay within the sigma-delta modulator.

7. The frequency synthesizer circuit of claim 1, wherein the divisor value comprises an integer part and a fractional part, the frequency synthesizer further comprising an adder circuit having a first input coupled to the output of the sigma-delta modulator for receiving a first input signal, and a second input coupled to receive a signal indicative of the integer part of the divisor value and the most significant bit of the fractional part of the divisor value, wherein the remaining bits of the multi-bit input signal received at the input of the sigma-delta modulator are indicative of the remainder of the fractional part of the divisor value.

8. The frequency synthesizer circuit of claim 1, wherein the frequency divider comprises a half-integer divider circuit.

9. The frequency synthesizer circuit of claim 8, wherein the half-integer divider circuit comprises:
- an integer divider receiving the local frequency signal from the controlled oscillator and receiving at least part of the control signal coupled to the control input of the frequency divider;
- a delay element coupled to an output of the integer divider and coupled to receive the local frequency signal from the controlled oscillator, the delay element adapted for adding to an output signal of the integer divider at least a half period delay of the local frequency signal to generate a delayed version of the output signal of the integer divider;
- a multiplexer coupled to an output of the delay element for receiving the delayed version or non-delayed version of the output signal of the integer divider; and
- an accumulator circuit for latching at least one bit of the control signal coupled to the control input of the frequency divider, an output of the accumulator circuit coupled to being added to the control signal coupled to the control input of the frequency divider for supplying to the integer divider, and further coupled to a select input of the multiplexer for selecting either the delayed version or non-delayed version of the output signal of the integer divider.

10. A frequency synthesizer circuit, comprising:
- a phase locked loop circuit comprising at least a phase detector, a controlled oscillator that generates a controlled frequency signal, and a frequency divider coupled to the controlled oscillator and having a control input to adjust a frequency division of the frequency divider in response to a received control signal generated from a divisor value;
- a dithering circuit that provides a dither signal;
- a sigma-delta modulator comprising an input to receive a multi-bit input signal indicative of at least part of the divisor value, and comprising an output, the input of the sigma-delta modulator coupled with the dithering circuit to receive the dither signal as a most significant bit of the multi-bit input signal;
- a multiplier circuit coupled to the output of the sigma-delta modulator for multiplying an output signal of the sigma-delta modulator by a factor of two;
- a delay circuit coupled to the dithering circuit to provide at an output a delayed dither signal, the delay of the delayed dither signal corresponding to a signal propagation delay within the sigma-delta modulator; and
- a subtraction circuit having a first input coupled to an output of the multiplier circuit to receive a first input signal, and a second input coupled to the output of the delay circuit to receive a second input signal, wherein the subtraction circuit is adapted to subtract the second input signal from the first input signal and to provide an output signal to be supplied to the control input of the frequency divider.

11. The frequency synthesizer circuit of claim 10, wherein the frequency divider comprises a half-integer divider circuit.

12. The frequency synthesizer circuit of claim 10, wherein the divisor value comprises an integer part and a fractional part, the frequency synthesizer further comprising an adder circuit having a first input coupled to the output of the sigma-delta modulator to receive a first input signal, and a second input coupled to receive a signal indicative of the integer part of the divisor value and the most significant bit of the fractional part of the divisor value, wherein the remaining bits of the multi-bit input signal received at the input of the sigma-delta modulator are indicative of the remainder of the fractional part of the divisor value.

13. The frequency synthesizer circuit of claim 10, wherein the multiplier circuit comprises a shifting circuit that shifts the output signal of the sigma-delta modulator by at least one bit.

14. A circuit, comprising:
- a phase locked loop circuit comprising a frequency divider having a control input and configured to adjust a frequency division of the frequency divider in response to a received control signal generated from a divisor value;
- a dithering circuit that provides a dither signal; and
- a sigma-delta modulator comprising an input to receive a multi-bit input signal indicative of at least part of the divisor value, the input coupled to the dithering circuit to receive the dither signal as a most significant bit of the multi-bit input signal, and an output coupled to the control input of the frequency divider.

15. The circuit of claim 14, further comprising a subtraction circuit having a first input coupled to the output of the sigma-delta modulator to receive a first input signal, and a second input coupled to the dithering circuit to receive the dither signal, wherein the subtracting circuit is adapted for subtracting the dither signal from the first input signal.

16. The circuit of claim 15, further comprising a delay circuit coupled between the subtraction circuit and the dithering circuit to delay the dither signal and providing a delayed dither signal to the subtraction circuit, the delay of the dither signal corresponding to a signal propagation delay within the sigma-delta modulator.

17. The circuit of claim 14, wherein the divisor value comprises an integer part and a fractional part, the frequency synthesizer further comprising an adder circuit having a first input coupled to the output of the sigma-delta modulator to receive a first input signal, and a second input coupled to receive a signal indicative of the integer part of the divisor value and the most significant bit of the fractional part of the divisor value, wherein the remaining bits of the multi-bit input signal received at the input of the sigma-delta modulator are indicative of the remainder of the fractional part of the divisor value.

* * * * *